United States Patent
Huang et al.

(10) Patent No.: US 10,325,977 B2
(45) Date of Patent: Jun. 18, 2019

(54) INTEGRATED TRANSFORMERS AND INTEGRATED BALANCED TO UNBALANCED TRANSFORMERS

(71) Applicant: REALTEK SEMICONDUCTOR CORPORATION, Hsinchu (TW)

(72) Inventors: Kai-Yi Huang, Taipei (TW); Yuh-Sheng Jean, Hsinchu County (TW); Ta-Hsun Yeh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/868,264

(22) Filed: Jan. 11, 2018

(65) Prior Publication Data

US 2018/0254313 A1   Sep. 6, 2018

(30) Foreign Application Priority Data

Mar. 6, 2017  (TW) .............................. 106107207 A

(51) Int. Cl.
  *H01L 49/02*   (2006.01)
  *H01L 23/528*  (2006.01)
  *H01L 23/522*  (2006.01)

(52) U.S. Cl.
  CPC ............ *H01L 28/10* (2013.01); *H01L 23/528* (2013.01); *H01L 23/5227* (2013.01); *H01L 23/5226* (2013.01)

(58) Field of Classification Search
  CPC ... H01L 28/10; H01L 23/5227; H01L 23/528; H01L 23/5226; H01L 2924/1206;
  (Continued)

(56) References Cited

U.S. PATENT DOCUMENTS 6,396,362 B1   5/2002  Mourant et al.
6,801,114 B2  10/2004  Yang et al.
(Continued)

FOREIGN PATENT DOCUMENTS

TW   201541476 A   11/2015
TW   201703070 A    1/2017

OTHER PUBLICATIONS

Niknejad, Ali M., Meyer, Robert G., "Design, Simulation and Applications of Inductors and Transformers for Si RF ICs", Jan. 1, 2000, p. 28-p. 29, Springer, United States.

*Primary Examiner* — Shahed Ahmed
(74) *Attorney, Agent, or Firm* — WPAT, PC

(57) ABSTRACT

A semiconductor element including first and second windings. The first winding is substantially located in a first metal layer of a semiconductor structure and includes a first outer coil, a first inner coil, and a first bridging structure. The first bridging structure, located in a range substantially enclosed by the first inner coil, connects the first outer coil and the first inner coil. The second winding is substantially located in a second metal layer of a semiconductor structure and includes a second outer coil, a second inner coil, and a second bridging structure. The second bridging structure, located in a range substantially enclosed by the second inner coil, connects the second outer coil and the second inner coil. The first bridging structure is substantially located in the second metal layer, and the second bridging structure is substantially located in the first metal layer.

5 Claims, 8 Drawing Sheets

(58) Field of Classification Search
CPC ....... H01L 2924/19042; H01L 27/0288; H01F 17/0006; H01F 17/02; H01F 27/29; H01F 2017/0086
See application file for complete search history.

(56) References Cited

U.S. PATENT DOCUMENTS

| | | |
|---|---|---|
| 7,164,339 B2 | 1/2007 | Huang |
| 7,808,356 B2 | 10/2010 | Papananos |
| 2012/0044034 A1* | 2/2012 | Nazarian ............. H01F 17/0013 336/200 |
| 2015/0310980 A1 | 10/2015 | Yen et al. |
| 2016/0027571 A1* | 1/2016 | Zhang ................ H01F 27/2804 336/173 |
| 2016/0203903 A1* | 7/2016 | Mattsson ............ H01F 17/0006 331/117 R |
| 2017/0012601 A1 | 1/2017 | Yen |
| 2017/0070199 A1* | 3/2017 | Anderson .............. B82Y 10/00 |
| 2018/0123550 A1* | 5/2018 | Wang ...................... H03H 7/42 |

* cited by examiner

INTEGRATED TRANSFORMERS AND INTEGRATED BALANCED TO UNBALANCED TRANSFORMERS

BACKGROUND OF THE INVENTION

1. Field of the Invention

The present invention generally relates to semiconductor elements, and, more particularly, to transformers and balanced to unbalanced transformers.

2. Description of Related Art

Inductors, transformers, and balanced to unbalanced transformers are important elements used in radio frequency (RF) integrated circuits (ICs) to realize conversion between single-ended and differential signals, signal coupling, and impedance matching. As system on chips (SoCs) become more popular among the ICs, integrated inductors and integrated transformers have gradually replaced traditional discrete elements and are widely employed in modern RF ICs. However, because low-resistance metal layers are few in a semiconductor structure and passive elements (such as inductors, transformers and balanced to unbalanced transformers) in the ICs often takes up plenty of chip area, it becomes an important issue as to how to make good use of these low-resistance metal layers and how to reduce the area of the passive elements while maintaining the characteristics of the elements (e.g., inductance, quality factor (Q), coupling coefficient (K), etc.).

SUMMARY OF THE INVENTION

In view of the issues of the prior art, an object of the present invention is to provide a semiconductor element with a small area and good characteristics, so as to make an improvement to the prior art.

A semiconductor element is disclosed. The semiconductor element includes a first winding and a second winding. The first winding is substantially located in a first metal layer of a semiconductor structure and includes a first outer coil, a first inner coil, and a first bridging structure. The first inner coil is located within a first range substantially enclosed by the first outer coil. The first bridging structure, located within a second range substantially enclosed by the first inner coil, connects the first outer coil and the first inner coil. The second winding is substantially located in a second metal layer of the semiconductor structure and includes a second outer coil, a second inner coil, and a second bridging structure. The second inner coil is located within a third range substantially enclosed by the second outer coil. The second bridging structure, located within a fourth range substantially enclosed by the second inner coil, connects the second outer coil and the second inner coil. The first bridging structure is substantially located in the second metal layer of the semiconductor structure, and the second bridging structure is substantially located in the first metal layer of the semiconductor structure.

A semiconductor element is also disclosed. The semiconductor element is substantially symmetrical with respect to an axis of symmetry and includes a first winding and a second winding. The first winding, substantially located in a first metal layer of a semiconductor structure, has a first terminal, a second terminal, and a third terminal. The first winding includes a first outer coil, a first inner coil, and a center tap. The first terminal and the second terminal are on the first outer coil. The first inner coil is located within a first range substantially enclosed by the first outer coil. The center tap forms the third terminal and is substantially located in a second metal layer of the semiconductor structure. The center tap extends from within a second range substantially enclosed by the first inner coil to outside the first range and is symmetrical with respect to the axis of symmetry. The second winding, substantially located in the first metal layer of the semiconductor structure, has a fourth terminal and a fifth terminal. The second winding includes a second outer coil and a second inner coil. The fourth terminal and the fifth terminal are on the second outer coil. The second inner coil is located within a third range substantially enclosed by the second outer coil.

A semiconductor element fabricated in three metal layers of a semiconductor structure is also disclosed. The semiconductor element includes a first winding, a second winding, and a third winding. The first winding includes a first outer coil, a first inner coil, and a first bridging structure. The first outer coil is located in a first metal layer. The first inner coil is located in the first metal layer and within a range substantially enclosed by the first outer coil. The first bridging structure, located in a second metal layer, connects the first outer coil and the first inner coil. The second winding includes a second outer coil, a second inner coil, and a second bridging structure. The second outer coil is located in the first metal layer. The second inner coil is located in the first metal layer and within a range substantially enclosed by the second outer coil. The second bridging structure, located in the second metal layer, connects the second outer coil and the second inner coil. The third winding substantially overlaps the first winding or the second winding and includes a third outer coil, a third inner coil, and a third bridging structure. The third outer coil is located in a third metal layer. The third inner coil is located in the third metal layer and within a range substantially enclosed by the third outer coil. The third bridging structure, located in the first metal layer or the second metal layer, connects the third outer coil and the third inner coil. The third bridging structure and multiple metal segments connected to the third bridging structure together form a U-shaped structure.

Because the semiconductor element of the present invention uses only a few number of metal layers, most metal segments of the semiconductor element can be fabricated in low-resistance metal layers of a semiconductor structure to thus obtain better element characteristics. In comparison with prior arts, the semiconductor element of the present invention is easier to fabricate and has better characteristics.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly.

Figure 1:
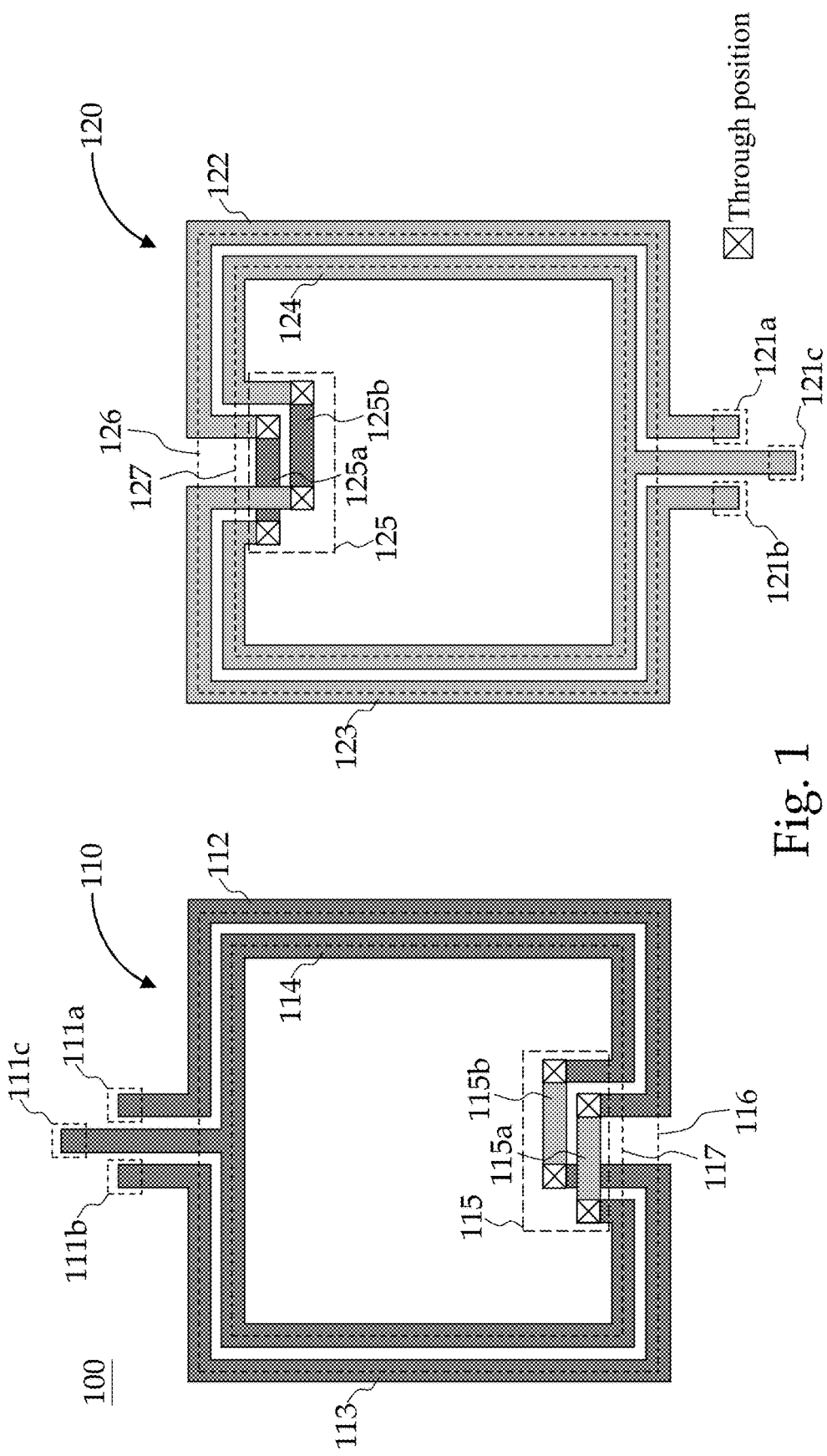
FIG. 1 illustrates a structure of a semiconductor element according to an embodiment of the present invention.

FIG. 1 shows a structure of a semiconductor element according to an embodiment of the present invention. The semiconductor element 100, which may be used as a transformer or a balanced to unbalanced transformer, includes a winding 110 and a winding 120. The winding 110 includes terminals 111a to 111c (111c is the endpoint of the center tap of the winding 110), metal segments 112 to 114, and the bridging structure 115. The bridging structure 115 includes metal segments 115a and 115b. The bridging structure 115 is substantially located in a first metal layer of the semiconductor structure (represented in light gray in FIG. 1, such as the re-distribution layer (RDL) of the semiconductor structure). Except for the metal segments 115a and 115b, the winding 110 is located in the second metal layer of the semiconductor structure (represented in dark gray in FIG. 1, such as the Ultra Thick Metal (UTM) layer of the semiconductor structure). Thus, the winding 110 is substantially located in the second metal layer. Similarly, the winding 120 includes terminals 121a-121c (121c is the endpoint of the center tap of the winding 120), metal segments 122 to 124, and the bridging structure 125. The bridging structure 125 includes metal segments 125a and 125b. The bridging structure 125 is substantially located in the second metal layer of the semiconductor structure. Except for the metal segments 125a and 125b, the winding 120 is located in the first metal layer of the semiconductor structure. Thus, the winding 120 is substantially located in the first metal layer. Both the winding 110 and the winding 120 are symmetrical structures (each is symmetrical with respect to the extension of the center tap). The metal segment 115a (or 115b) of the bridging structure 115 and the metal segments connected to the metal segment 115a (or 115b) together form a U-shaped structure, and the two metal segments 115a and 115b are substantially parallel.

The metal segment 112 and the metal segment 113 form an outer coil of the winding 110. The metal segment 114 forms the inner coil of the winding 110. The inner coil is located within the range 116 substantially enclosed by the outer coil. The bridging structure 115, located within a range 117 substantially enclosed by the inner coil, connects the outer coil and the inner coil. More specifically, the metal segment 115a connects the metal segments 112 and 114 through the via structure, the via array or the through-silicon Via (TSV) in the through positions. The metal segment 115b connects the metal segments 113 and 114. Similarly, as to the winding 120, the metal segment 122 and the metal segment 123 form the outer coil of the winding 120, while the metal segment 124 forms the inner coil of the winding 120. The inner coil is located within the range 126 substantially enclosed by the outer coil. The bridging structure 125, located within a range 127 substantially enclosed by the inner coil, connects the outer coil and the inner coil. More specifically, the metal segment 125a connects the metal segments 122 and 124; the metal segment 125b connects the metal segments 123 and 124.

Figure 2:
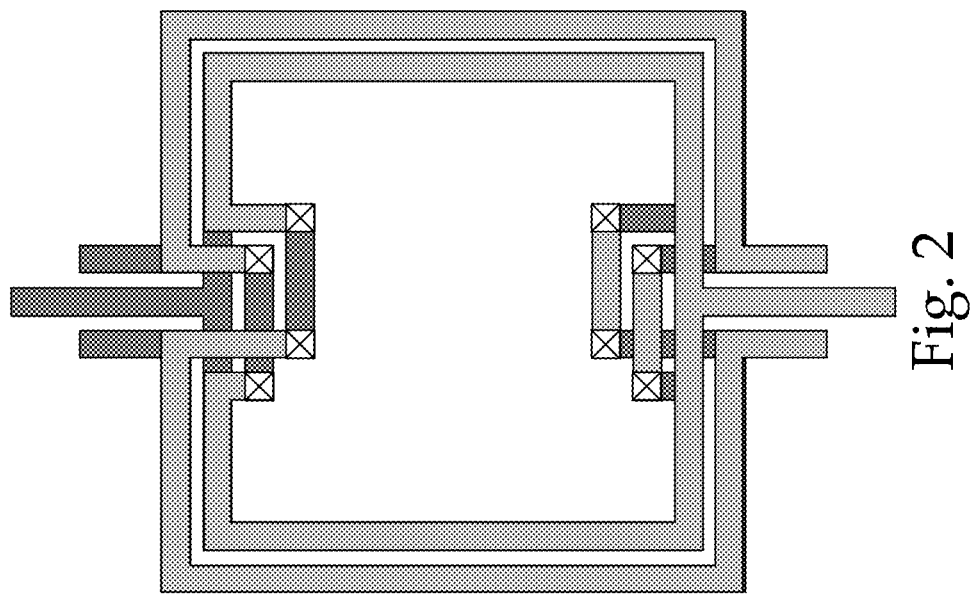
FIG. 2 illustrates the top view of the semiconductor element 100.

The top view of the semiconductor element 100 is shown in FIG. 2, in which the winding 110 and the winding 120 substantially overlap. More specifically, the outer coils of the windings 110 and 120 overlap, and the inner coils of the windings 110 and 120 overlap. Because the magnetic fields of the windings 110 and 120 are vertically coupled (with respect to the first or second metal layer, i.e., the coupling is perpendicular to the plane where the winding 110 or 120 locates), the semiconductor element 100 forms a stacked transformer or a stacked balanced to unbalanced transformer, with one of the windings 110 and 120 being the primary coil and the other the secondary coil. Observe from FIG. 2 that, because the semiconductor element 100 is fabricated using only two metal layers of the semiconductor structure, the semiconductor element 100 is easier to implement (particularly suitable for the process of making integrated passive devices as that process includes at most three metal layers), and all of the metal segments can be fabricated in the low-resistance RDL and UTM layer of the semiconductor structure, making the semiconductor element 100 have a high coupling coefficient. In addition, the windings 110 and 120 each have excellent symmetry so that when the winding 110 (or 120) is used separately as an inductive element that includes two inductive units, the inductive characteristics of these two inductive units are substantially identical. One of the two inductive units takes the terminals 111a (or 121a) and 111c (or 121c) as its two terminals and contains the metal segment 112 (or 122), the metal segment 115a (or 125a), and the left half of the metal segment 114 (or 124), whereas the other takes the terminals 111b (or 121b) and 111c (or 121c) as its two terminals and contains the metal segment 113 (or 123), the metal segment 115b (or 125b), and the right half of the metal segment 114 (or 124).

Figure 3:
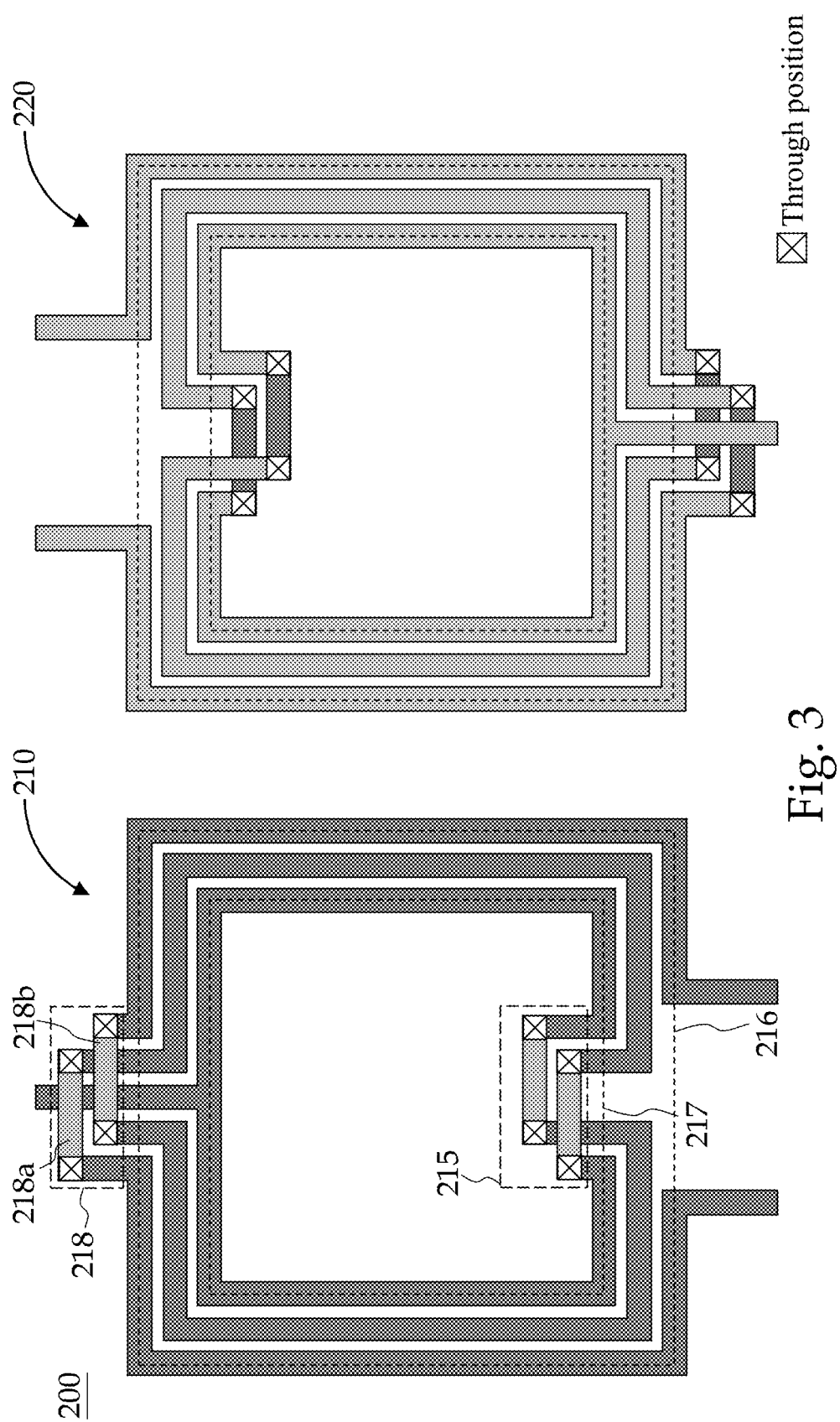
FIG. 3 illustrates a structure of the semiconductor element according to another embodiment of the present invention.
Figure 4:
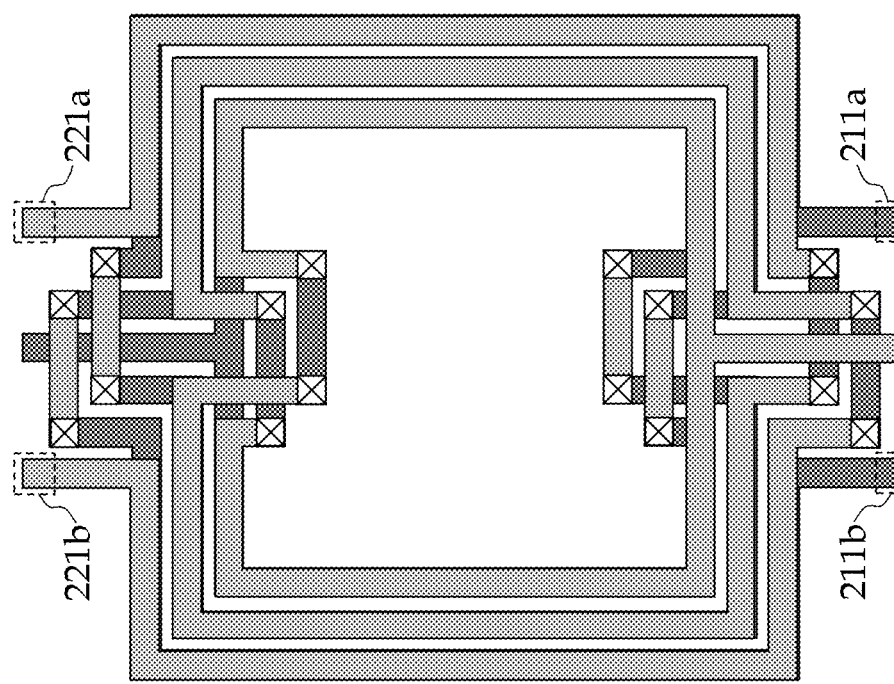
FIG. 4 illustrates the top view of the semiconductor element 200.

FIG. 3 is a structure of the semiconductor element according to another embodiment of the present invention. The semiconductor element 200 is similar to the semiconductor element 100, except that the winding 210 and the winding 220 of the semiconductor element 200 are each a three-turn structure, implying that each includes two bridging structures. Taking the winding 210 for example, the bridging structure 215 is located within the range 217 substantially enclosed by the inner coil, while the bridging structure 218 is located outside the range 216 substantially enclosed by the outer coil. The winding 220 has a similar structure and the descriptions are thus omitted. The top view of the semiconductor element 200 is shown in FIG. 4, in which the winding 210 and the winding 220 substantially overlap. The semiconductor element 200 takes the two terminals 211a and 211b as one of the output port and the input port, and takes the two terminals 221a and 221b as the other. The center taps of the winding 210 and the winding 220 may, for example, be grounded. The output and input ports are formed on the outer coils of the windings 210 and 220. As shown in the figure, the distance between the two terminals of the output/input port is greater than the lengths of the two metal segments of the bridging structure (e.g., the distance between the terminals 221a and 221b is greater than the lengths of the metal segments 218a and 218b).

Figure 5B:
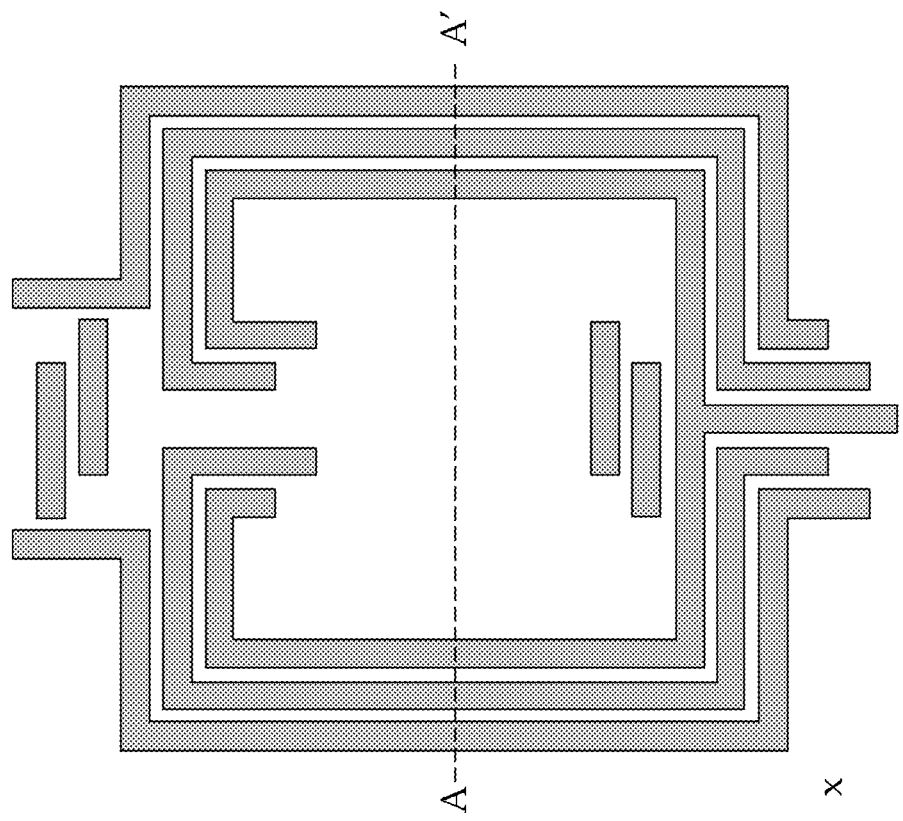
FIGS. 5A and 5B illustrate the layout of the metal segments of the semiconductor element 200 in the lower metal layer and the upper metal layer, respectively.
Figure 5A:
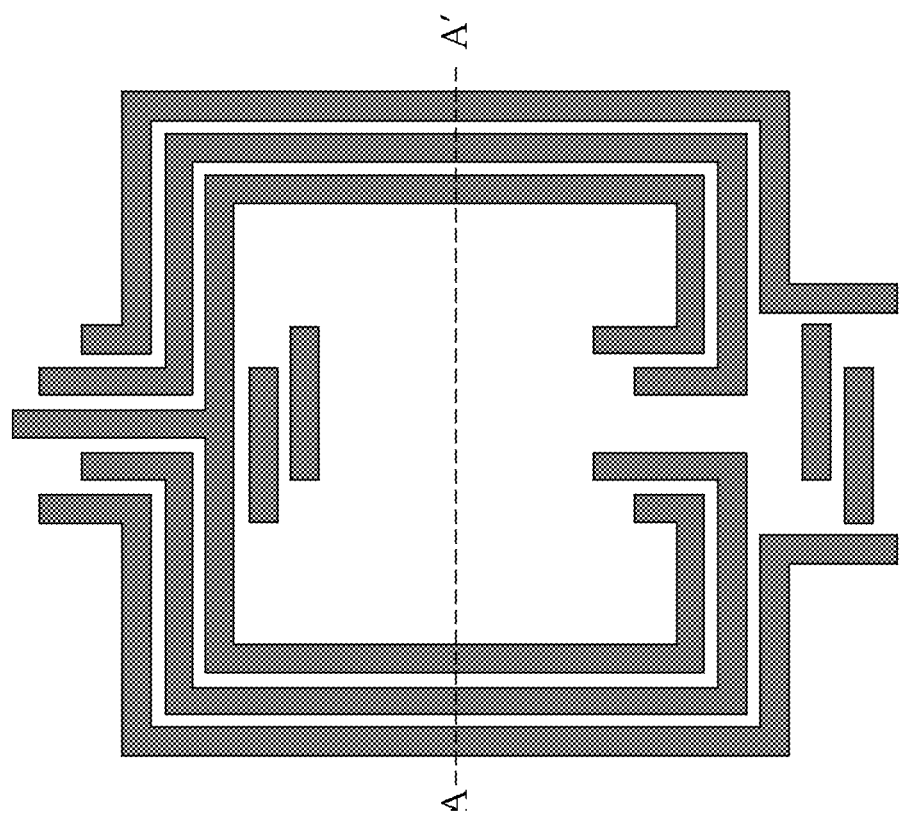

FIGS. 5A and 5B show the layout of the metal segments of the semiconductor element 200 in the lower metal layer and the upper metal layer, respectively. Observe from the two figures that, the semiconductor element 200 of the present invention requires only two metal layers to implement, and the layout of all the metal segments in one of the layers can be obtained by turning upside down (turning by 180 degrees) the layout of all the metal segments in the other layer provided that the two windings have the same numbers of turns. More specifically, FIG. 5B can be obtained by flipping FIG. 5A along the axis A-A', and vice versa. The axis A-A' is perpendicular to the center taps and roughly evenly divides the ranges enclosed by the inner and outer coils. In other embodiments, the two windings of the semiconductor element of the present invention may have different numbers of turns.

Since the semiconductor element 100 (or 200) uses only two metal layers, the semiconductor element 100 (or 200) can be fabricated in the low-resistance RDL and UTM layer of a semiconductor structure. As the low-resistance metal layers can withstand high current and have relatively low parasitic resistance, the characteristics of the element are improved especially in applications (e.g., power amplifiers) where large currents pass through the element.

Figures 6A, 6B:
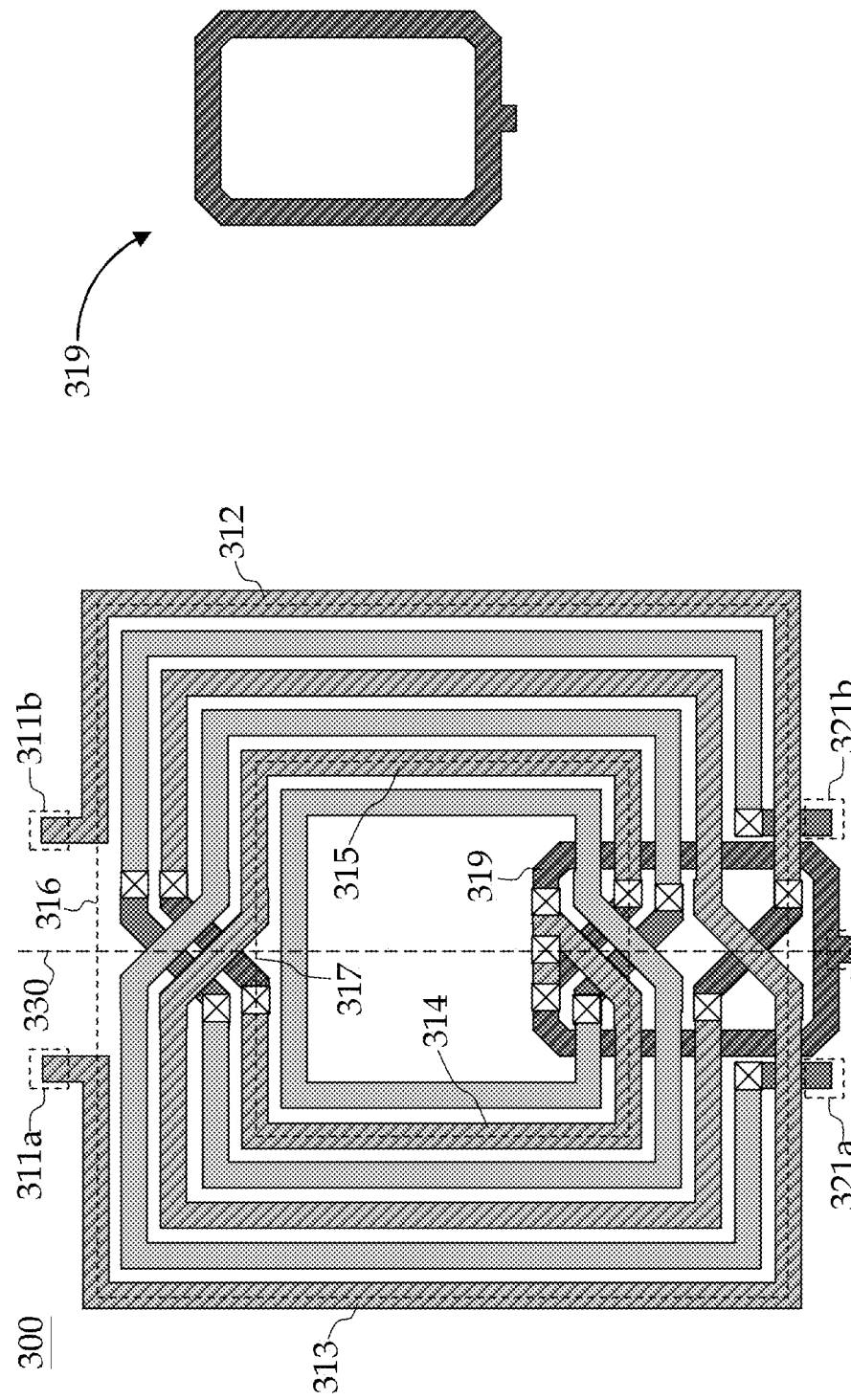
FIGS. 6A and 6B illustrate structures of a semiconductor element according to another embodiment of the present invention.

FIGS. 6A and 6B are structures of a semiconductor element according to another embodiment of the present invention. FIG. 6A shows a lateral-coupling planar transformer, which is symmetrical with respect to the axis of symmetry 330 and substantially located in the same metal layer of the semiconductor structure. More specifically, except for the bridging structure and the center tap 319, the metal segments of the semiconductor element 300 are substantially located in the metal layer in light gray (with or without slanted lines). The semiconductor element 300 includes two windings.

The first winding, represented by slanted lines, includes terminals 311a, 311b, and 311c, with the terminal 311c being the endpoint of the center tap 319 of the first winding. The center tap 319 is also symmetrical with respect to the axis of symmetry 330. The first winding includes an outer coil, formed by the metal segment 312 and the left half of the metal segment 313, and at least one inner coil, formed by, for example, the metal segment 314 and the right half of the metal segment 315. The terminals 311a and 311b are on the outer coil. The inner coil is located within the range 316 substantially enclosed by the outer coil. The center tap is fabricated in another metal layer in dark gray and extends from within the range 317 substantially enclosed by the inner coil to outside the range 316. The first winding includes two inductive units, one of which uses the terminals 311a and 311c as its two terminals, and the other uses terminals 311b and 311c as its two terminals.

The second winding is located within the range 316 and includes terminals 321a and 321b. Similarly, the second winding has an outer coil and an inner coil, and the inner coil is within a range substantially enclosed by the outer coil. The terminals 321a and 321b are on the outer coil.

The semiconductor element 300 further includes multiple bridging structures that are located on the axis of symmetry 330 and made in the metal layer in dark gray. The bridging structures connect an outer coil and an inner coil or two adjacent inner coils of a winding. The center tap 319 does not overlap the bridging structures.

FIG. 6B shows the center tap 319 separately. The center tap 319 is a closed polygonal (or circular) structure symmetrical with respect to the axis of symmetry 330. As shown in FIG. 6A, the region that the center tap 319 encloses includes at least one bridging structure.

Figure 7:
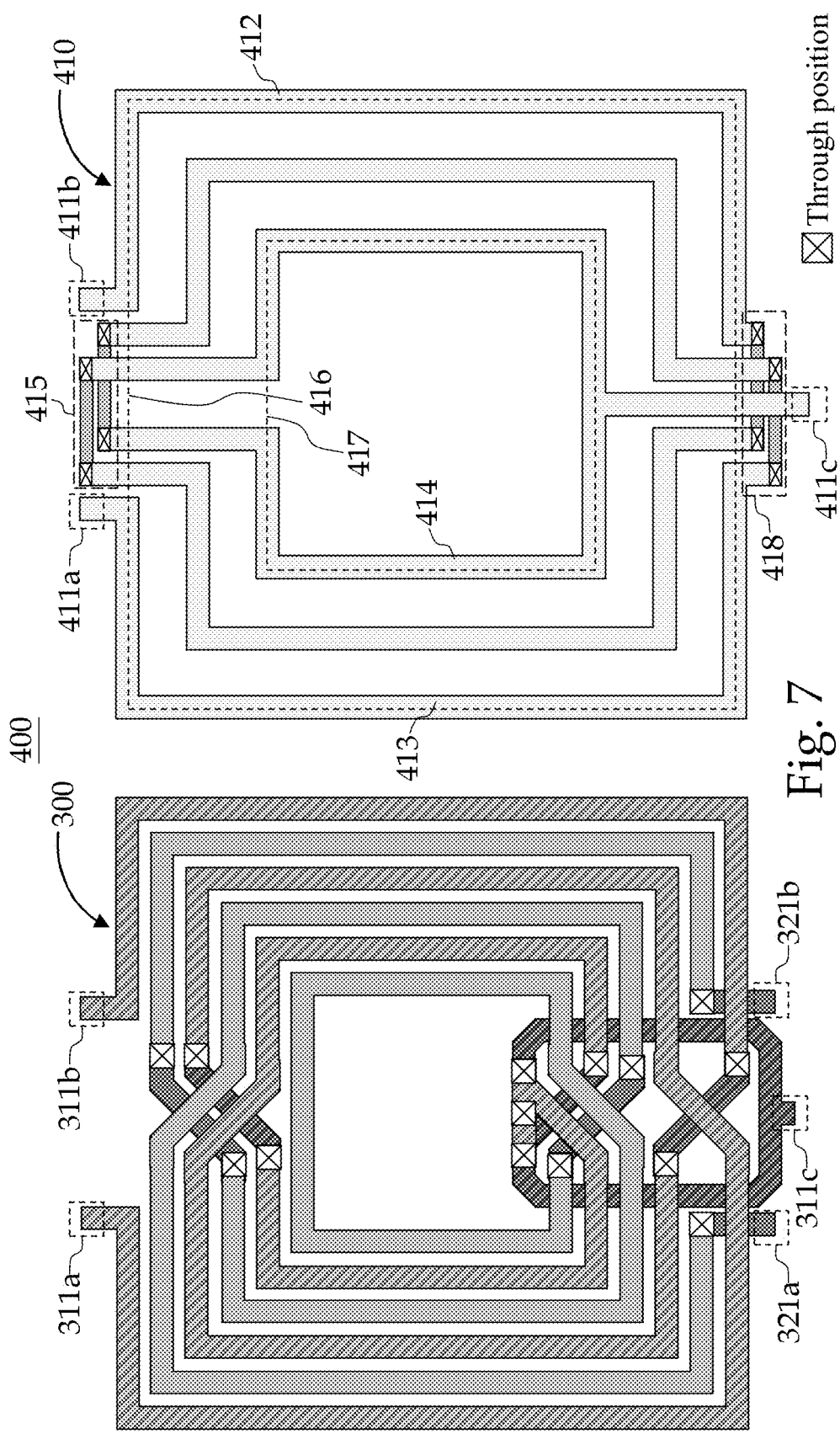
FIG. 7 illustrates a structure of a semiconductor element according to another embodiment of the present invention.
Figure 8:
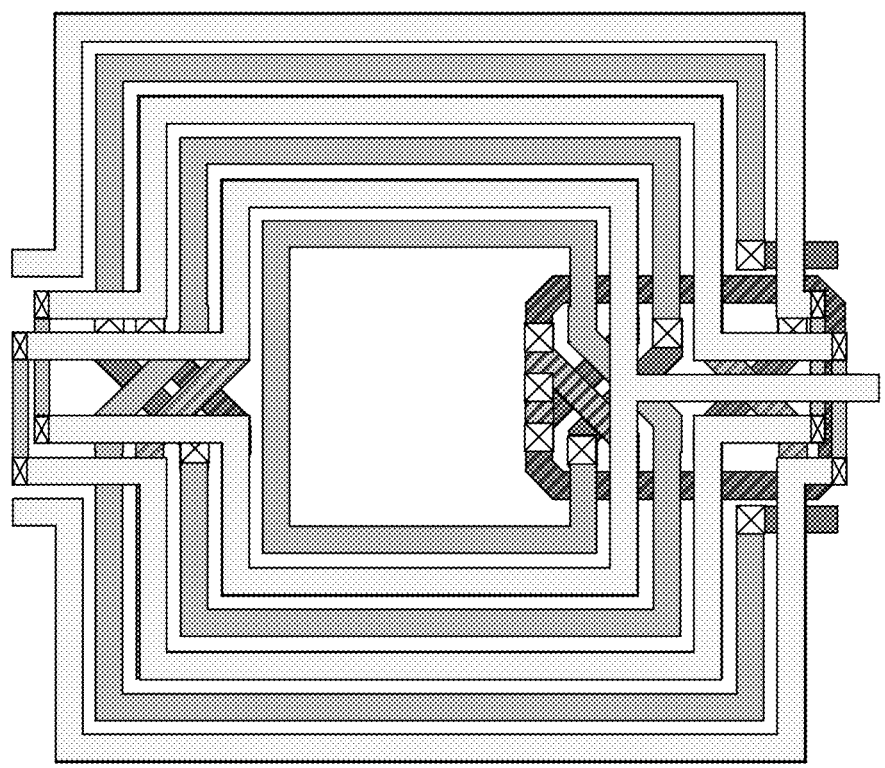
FIG. 8 illustrates the top view of the semiconductor element 400.

FIG. 7 is a structure of a semiconductor element according to another embodiment of the present invention. The semiconductor element 400 includes the semiconductor element 300 and a winding 410. The winding 410 is implemented in a third metal layer, which is different from the two metal layers where the semiconductor element 300 is fabricated. The winding 410 includes an outer coil (formed by the metal segment 412 and the metal segment 413) and at least one inner coil (e.g., formed by the metal segment 414). The terminals 411a and 411b are on the outer coil. The inner coil is within the range 416 substantially enclosed by the outer coil. The terminal 411c is the endpoint of the center tap of the winding 410. The winding 410 includes the bridging structures 415 and 418 that connect the outer coil and the inner coil. The bridging structure 415 (or 418) mainly includes two metal segments. The two metal segments are fabricated in one of the two metal layers where the semiconductor element 300 is substantially fabricated. Thus, when the semiconductor element 300 and the winding 410 are stacked to form a semiconductor element 400 including three windings (the top view thereof is shown in FIG. 8), the element is fabricated using only three metal layers of the semiconductor structure. In this embodiment, the bridging structure 415 (or 418) is outside the range 416, whereas in other embodiments the bridging structure 415 (or 418) may be fabricated within the range 417.

When the semiconductor element 400 is used as a balanced to unbalanced transformer, the combination of the two windings of the semiconductor element 300 may be used for converting a differential signal into a single-ended signal (e.g., applied to the output of an RF circuit), while the combination of one of the windings of the semiconductor element 300 and the winding 410 may be used for converting a single-ended signal into a differential signal (e.g., applied to the input of an RF circuit). More specifically, when the semiconductor element 400 is applied to the output of an RF circuit, the differential signal is inputted through the two terminals 311a and 311b of the first winding and is output through the terminal 321a of the second winding (the terminals 311c and 321b are grounded); when the semiconductor element 400 is applied to the input of an RF circuit, the single-ended signal is inputted through the terminal 321a and is outputted through the two terminals 411a and 411b of the winding 410 (the terminals 321b and 411c are grounded). That is, the semiconductor element 400 may be shared by the output and the input of an RF circuit and uses only three metal layers.

The shape, size, and ratio of any element in the disclosed figures are exemplary for understanding, not for limiting the scope of this invention. In addition, although the foregoing embodiments use integrated transformers and integrated balanced to unbalanced transformers as examples, this invention is not limited thereto. Those skilled in the art may apply this invention to other types of semiconductor elements according to the disclosure of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:
1. A semiconductor element comprising:
a first winding, substantially located in a first metal layer of a semiconductor structure, comprising:
a first outer coil;
a first inner coil located within a first range substantially enclosed by the first outer coil; and a first bridging structure, located within a second range substantially enclosed by the first inner coil, connecting the first outer coil and the first inner coil; and a second winding, substantially located in a second metal layer of the semiconductor structure, comprising:

a second outer coil;

a second inner coil located within a third range substantially enclosed by the second outer coil; and a second bridging structure, located within a fourth range substantially enclosed by the second inner coil, connecting the second outer coil and the second inner coil;

wherein, the first bridging structure is substantially located in the second metal layer of the semiconductor structure, and the second bridging structure is substantially located in the first metal layer of the semiconductor structure.

2. The semiconductor element of claim 1, wherein the first bridging structure comprises a first metal segment and a second metal segment located in the second metal layer.

3. The semiconductor element of claim 2, wherein the first metal segment and the second metal segment are substantially parallel.

4. The semiconductor element of claim 2, wherein the first metal segment and a plurality of metal segments connected to the first metal segment together form a U-shaped structure.

5. The semiconductor element of claim 2, wherein the first winding comprises a first inductive unit and a second inductive unit, the first inductive unit is formed by a first portion of the first outer coil, the first metal segment, and a first portion of the first inner coil, and the second inductive unit is formed by a second portion of the first outer coil, the second metal segment, and a second portion of the first inner coil.

* * * * *